United States Patent
Kubota

(10) Patent No.: US 6,246,086 B1
(45) Date of Patent: Jun. 12, 2001

(54) STRUCTURE OF CAPACITOR FOR DYNAMIC RANDOM ACCESS MEMORY AND METHOD OF MANUFACTURING THEREOF

(75) Inventor: Michitaka Kubota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/138,624

(22) Filed: Aug. 24, 1998

Related U.S. Application Data

(62) Division of application No. 08/883,362, filed on Jun. 26, 1997, now Pat. No. 5,869,382.

(30) Foreign Application Priority Data

Jul. 2, 1996 (JP) .................................................. 8-191472

(51) Int. Cl.⁷ .................................................. H01L 27/108
(52) U.S. Cl. .................... 257/301; 257/308; 257/309; 257/310; 257/381; 257/385; 257/488; 438/240; 438/254; 438/397
(58) Field of Search ........................... 257/301, 310, 257/308, 309, 488, 381, 385; 438/397, 254, 240

(56) References Cited

U.S. PATENT DOCUMENTS

| | | | |
|---|---|---|---|
| 5,236,855 | * 8/1993 | Dennison et al. | 437/47 |
| 5,281,549 | * 1/1994 | Fazan et al. | 437/52 |
| 5,492,850 | 2/1996 | Ryou . | |
| 5,550,076 | 8/1996 | Chen . | |
| 5,621,606 | * 4/1997 | Hwang | 361/321.4 |
| 5,688,726 | * 11/1997 | Kim | 438/397 |
| 5,702,989 | 12/1997 | Wang et al. . | |
| 5,770,510 | * 6/1998 | Lin et al. | 438/396 |
| 5,847,423 | * 12/1998 | Yamamichi | 257/296 |
| 5,856,220 | * 1/1999 | Wang et al. | 438/254 |

FOREIGN PATENT DOCUMENTS

| | | | |
|---|---|---|---|
| 405021744 | * 1/1993 | (JP) | 257/310 |
| 40530422 | * 11/1993 | (JP) | H01L/27/108 |

OTHER PUBLICATIONS

Stacked Capacitor DRAM with vertical fins (VF–STC), IBM Technical Disclosure Bulletin, vol. 33 No. 2, Jul. 1990.*

* cited by examiner

Primary Examiner—Eddie C. Lee
Assistant Examiner—Edgardo Ortiz
(74) Attorney, Agent, or Firm—Sonnenschein, Nath & Rosenthal

(57) ABSTRACT

A lower electrode of a capacitor is formed by a cylindrical conductive film and a pillar shaped conductive film disposed coaxially within the cylindrical conductive film. Consequently, in this capacitor, even if a plane area of the lower electrode is so small that double cylinder type cannot be realized, opposing area of the lower electrode and upper electrode is larger as compared to a structure in which the lower electrode is of single cylinder type. This invention proposes such a capacitor and a method of manufacturing thereof. As a result, it is possible to increase electric storage capacity if the plane area of the capacitor is the same and further miniaturize the capacitor if the electric storage capacity is the same.

6 Claims, 7 Drawing Sheets

STRUCTURE OF CAPACITOR FOR DYNAMIC RANDOM ACCESS MEMORY AND METHOD OF MANUFACTURING THEREOF

CROSS-REFERENCE TO RELATED APPLICATION

This Application is a Divisional of prior application Ser. No. 08/883,362, filed Jun. 26, 1997 now U.S. Pat. No. 5,869,382.

BACKGROUND OF THE INVENTION

1. Field of the Invention

This invention relates to a capacitor wherein a lower electrode made of conductive film opposes an upper electrode through a capacitive insulating film and is applied to a large capacity DRAM (Dynamic RAM).

2. Description of the Related Art

In the DRAM, a capacitor composing a memory cell must possess an electric storage capacity larger than a predetermined level in order to assure a predetermined or higher read-out voltage and refresh interval and prevent a soft error even if the memory cell area is reduced because of miniaturization and increased capacity.

Conventionally, to increase the electric storage capacity without increasing the area of the capacitor, the SiO film as the capacitive insulating film was thinned and if thinning of the $SiO_2$ film reached its limit, an ONO film having a higher dielectric constant than the $SiO_2$ film was utilized as the capacitive insulating film. Further, application of such high dielectric constant insulating films as a $Ta_2O_5$ film, a BST film, an STO film or the like are considered.

As a concrete proposal for increasing the electric storage capacity without increasing a plane area of the capacitor, Mr. Youichi Miyasaka, Basic Research Center, NEC announced "A possibility of BST series thin film for DRAM" at ULSI high dielectric constant thin film technology forum '95 (Feb. 3, 1995, Tokyo Garden Palace).

In the related arts, a first conventional example in which as shown in FIG. 1, the lower electrode was formed in a cylinder shape so that electricity was stored in its external side wall and internal side wall as well and a second conventional example in which as shown in FIGS. 2a and 2b, the lower electrode was formed in double cylinder shape so as to allow storage of electricity on a wider side wall are considered.

Assume that the external dimensions of the lower electrode in the first conventional example shown in FIG. 1 are L, W, and H and the thickness of the conductive film forming the lower electrode is d, internal dimensions $L_1$, $W_1$, $H_1$ are as follows:

$$L_1 = L - 2d, \ W_1 = W - 2d, \ H_1 = H - d.$$

Thus, the surface area S of the lower electrode in the first conventional example is;

$$S = 2H(L+W) + 2H_1(L_1+W_1) + LW$$

Assuming that the dimensions of respective parts of the lower electrode in the second conventional example shown in FIGS. 2a and 2b are as shown in Figure, following can be obtained.

$$L_1 = L - 2d, \ W_1 = W - 2d, \ H_1 = H - d$$

$$L_2 = L - 4d, \ W_2 = W - 4d, \ H_2 = H - 2d$$

$$L_3 = L - 6d, \ W_3 = W - 6d$$

Thus, the surface area S of the lower electrode in the second conventional example is;

$$S = 2H(L+W) + 2H_1(L_1+W_1) + LW + 2H_1(L_2+W_2) + 2H_2(L_2+W_3)$$

This is larger than the first conventional example by only last two terms, thus it is more advantageous for increasing the electric storage capacity.

However if the memory cell area is reduced because of miniaturization and increased capacity of the DRAM so that the plane area of the lower electrode of the capacitor is also reduced, in the second conventional example shown in FIGS. 7a and 7b, a smaller one of L3 and W3 becomes 0. Consequently, a cylinder inside is crushed, so that a double cylinder type cannot be realized. Thus in such a case, conventionally, the first conventional example shown in FIG. 1 was utilized.

OBJECT AND SUMMARY OF THE INVENTION

As evident from the above description, in the first conventional example in which the lower electrode is a single cylinder type, the electric storage capacity is difficult to increase and in the DRAM using the first conventional example, it is difficult to improve the reliability and reduce production cost.

Accordingly, according to claim 1 of the present invention, there is provided a capacitor wherein a lower electrode made of conductive film opposes an upper electrode through a capacitive insulating film characterized in that a pillar shaped second conductive film is disposed coaxially in a cylindrical first conductive film.

According to claim 2 of the present invention, there is provided a capacitor characterized in that the capacitor is a component of a memory cell and the lower electrode is a storage node electrode of the memory cell.

Because in the capacitor of the present invention, its second conductive film is not a cylinder but pillar, even if the plane area of the lower electrode is so small that double cylinders cannot be realized, a second pillar shaped conductive film can be disposed within the first cylindrical conductive film. Thus, even if the plane area of the lower electrode is so small that the double cylinders cannot be realized, opposing area of the lower electrode and upper electrode is larger as compared to the structure in which the lower electrode is of single cylinder type. Thus, if the plane area of the capacitor is the same, the electric storage capacity can be increased and if the electric storage capacity is the same, the capacitor can be miniaturized.

DETAILED DESCRIPTION OF THE PREFERRED EMBODIMENT

Figure 3A:
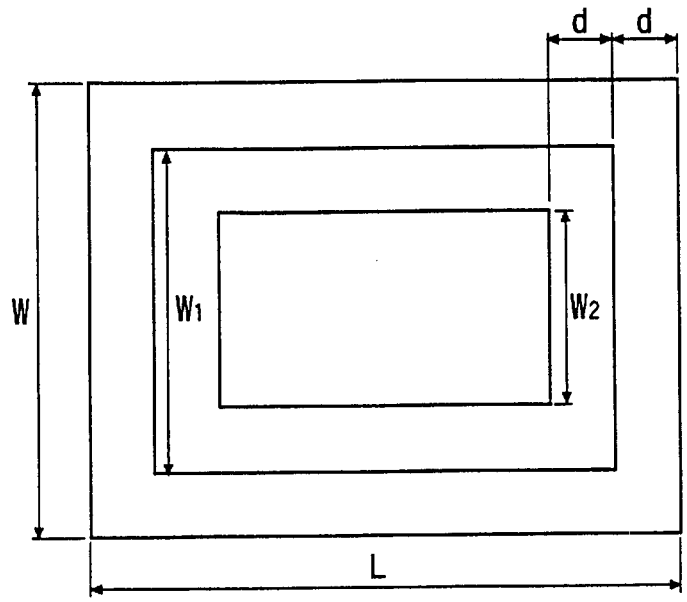
FIGS. 3a and 3b are respectively a schematic plan view and a schematic side view of the lower electrode of the capacitor according to an embodiment of the present invention.
Figure 3B:
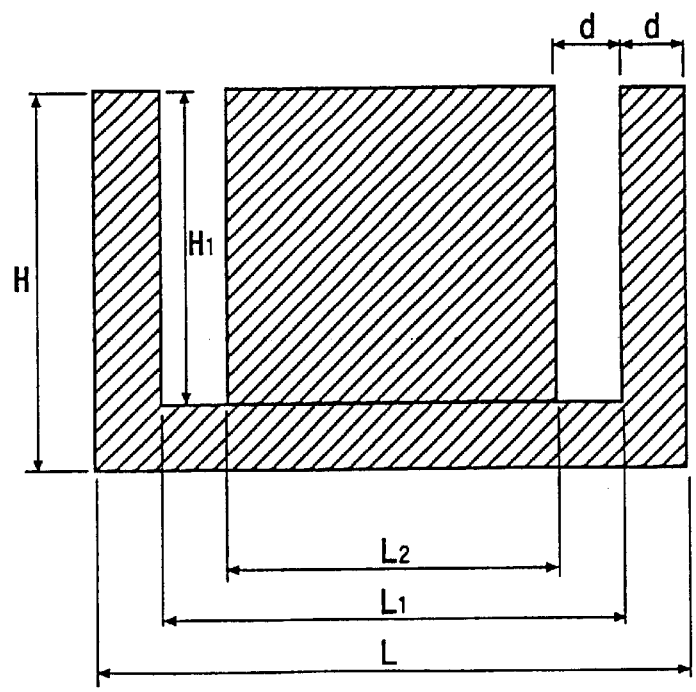
Figure 4:
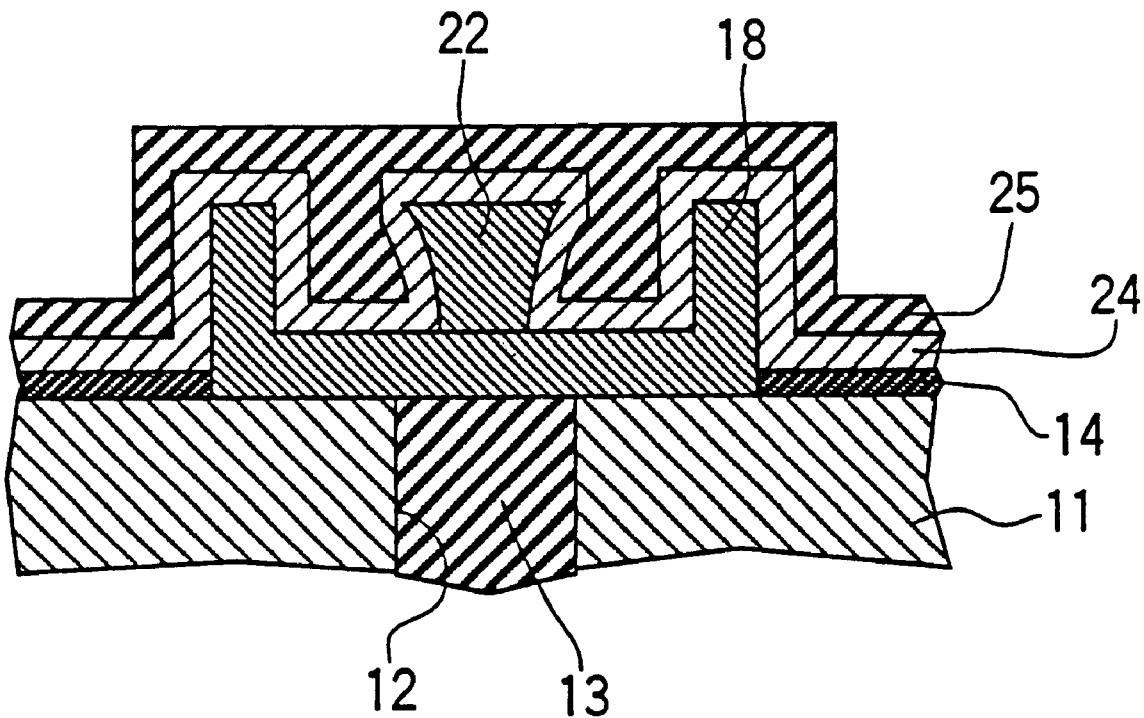
FIG. 4 is a side sectional view of the capacitor according to the embodiment of the present invention.

An embodiment of the present invention which is applied to DRAM memory cell will be described with reference to the accompanying drawings. FIG. 4 shows a capacitor according to the present embodiment and FIGS. 3a and 3b show schematically a lower electrode of this capacitor. As evident from FIGS. 3a and 3b, the lower electrode of the capacitor according to the present embodiment comprises a cylindrical conductive film and a pillar shaped conductive film disposed coaxially in the cylindrical conductive film.

The dimension of each part of the lower electrode of the present embodiment shown in FIGS. 3a and 3b is as follows.

$$L_1 = L - 2d, \ W_1 = W - 2d, \ H_1 = H - d$$

$$L_2 = L - 4d, \ W_2 = W - 4d$$

Thus, the surface area S of the lower electrode of the present embodiment is:

$$S = 2H(L+W) + 2H_1(L_1+W_1) + LW + 2H_1(L_2+W_2)$$

Figure 1:
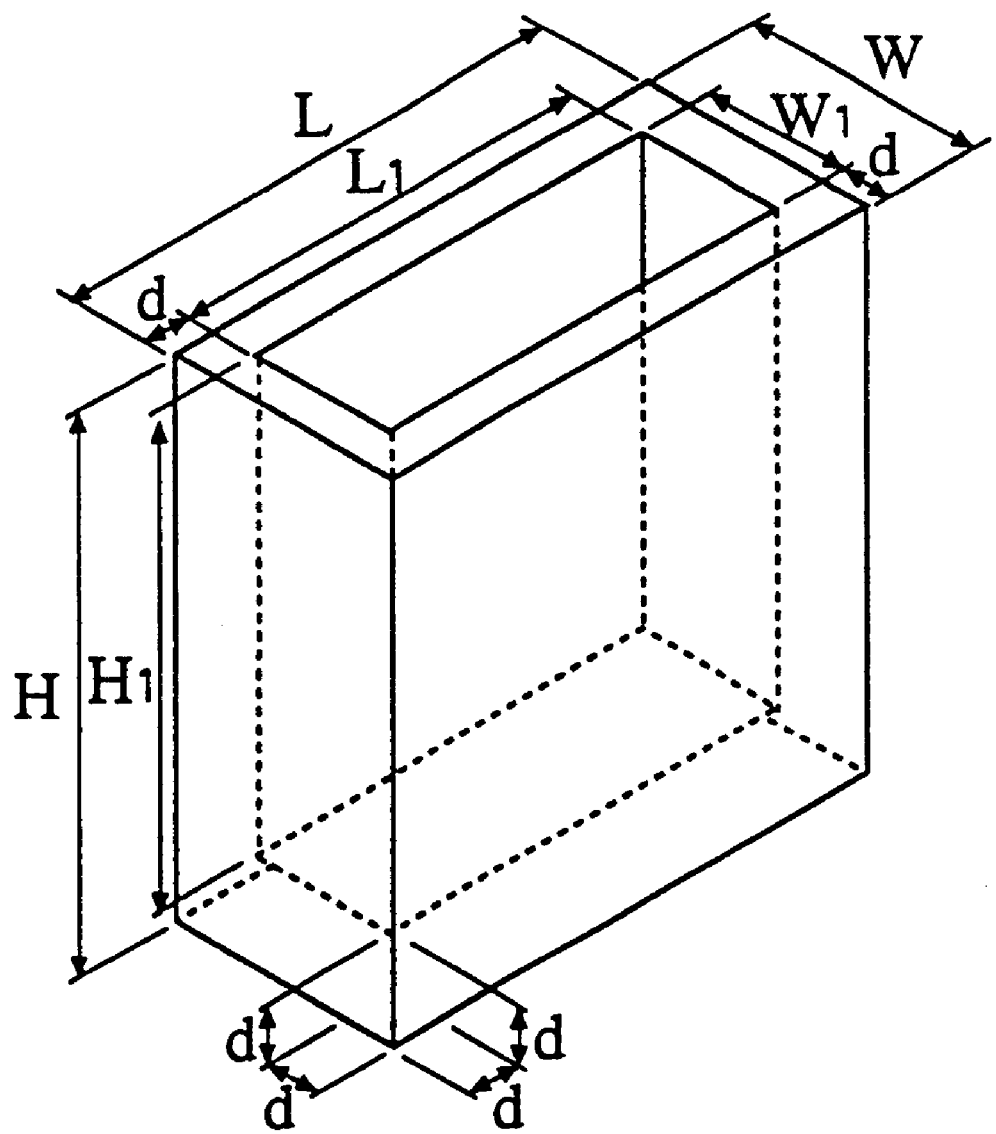
FIG. 1 is a perspective view of a lower electrode in a capacitor according to a first conventional example.
Figure 2A:
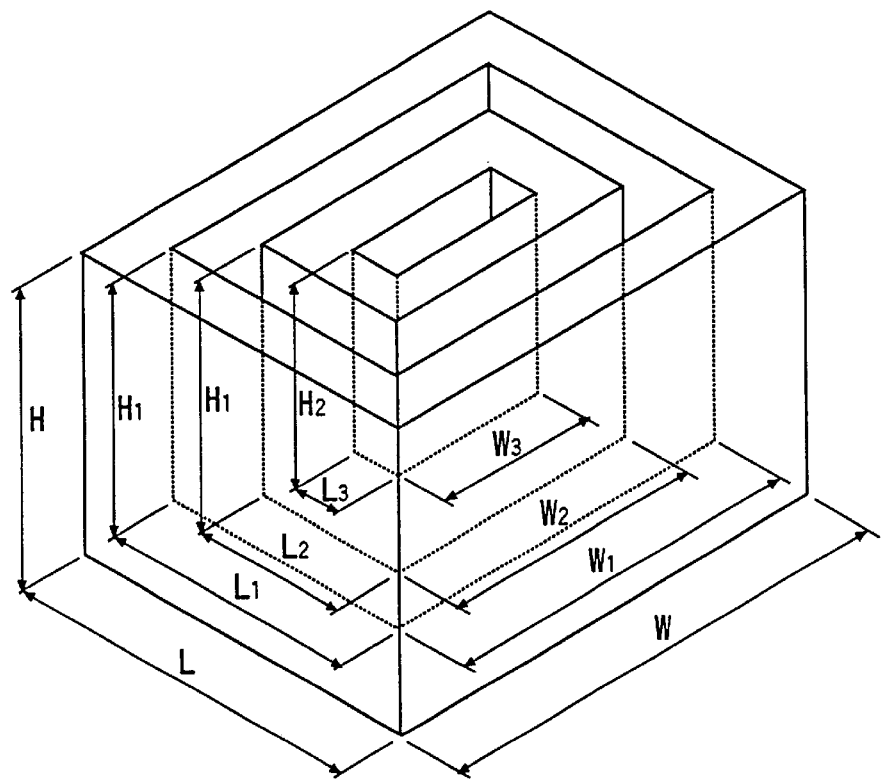
FIGS. 2a and 2b are respectively a perspective view and a side view of the capacitor of a second conventional example.
Figure 2B:
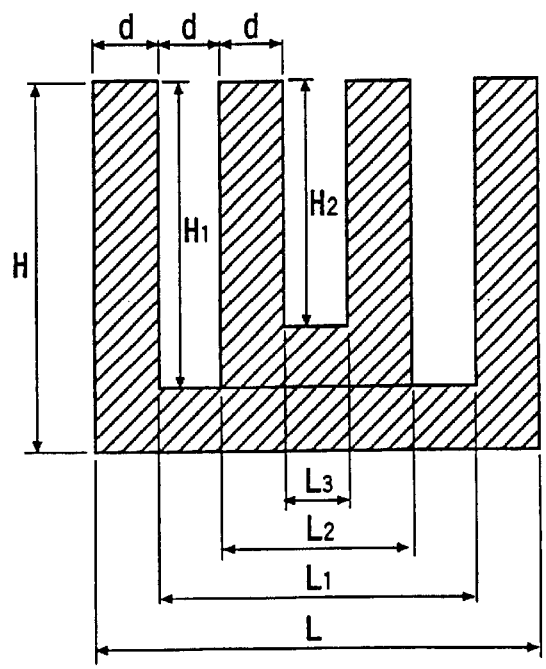

Although this is smaller than the second conventional example shown in FIGS. 2a and 2b, it is larger than the first conventional example shown in FIG. 1 by only the last term and thus in a fine DRAM in which double cylinders can not be realized, the memory cell capacity can be made larger than the first conventional example.

Figure 5A:
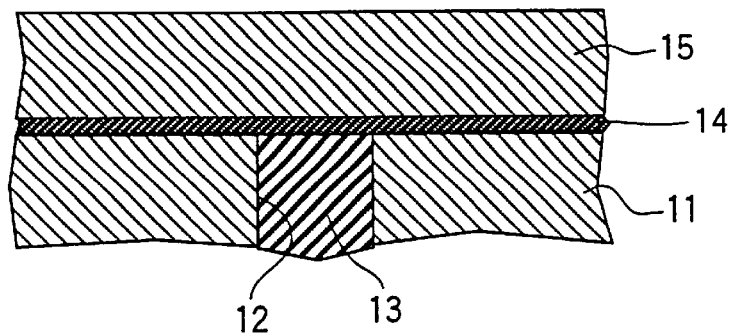
FIGS. 5a, 5b and 5c are side sectional views sequentially indicating initial processes of manufacturing method according to the embodiment of the present invention.

FIGS. 5a to 7c show a manufacturing method of the present embodiment. To manufacture the present embodiment, as shown in FIG. 5a, after a transistor (not shown) and the like composing the memory cell are formed, the transistor and the like are covered with interlayer insulating film such as an $SiO_2$ film 11 and a contact hole 12 which reaches one source/drain of the transistor is opened in the $SiO_2$ film 11.

The contact hole 12 is filled with a polycrystalline Si plug 13 containing phosphorus or the like and then an SiN film 14 having a thickness of 50 nm and an $Sio_2$ film 15 are deposited successively on entire surface by the CVD method or the like. The surface of the $SiO_2$ film 15 is planarized by chemical mechanical polishing, etchback or the like. The $SiO_2$ film 15 is deposited so that a thickness of about 500 nm is left after the planarization.

Figure 5B:
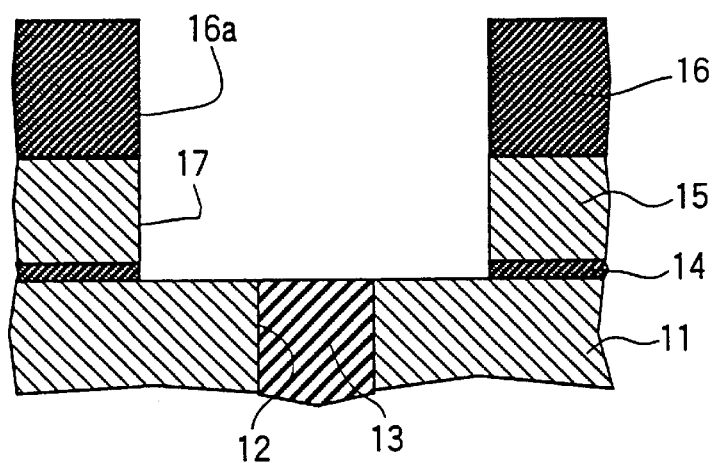

Next, as shown in FIG. 5b, a resist 16 is coated on the $SiO_2$ film 15 and an opening 16a of pattern of an area in which the lower electrode of the capacitor composing the memory cell or a storage node electrode is to be formed is formed in the resist 16 by lithography. Then, an opening 17 is formed in the $SiO_2$ film 15 and the SiN film 14 by RIE or the like using the resist 16 as a mask.

Figure 5C:
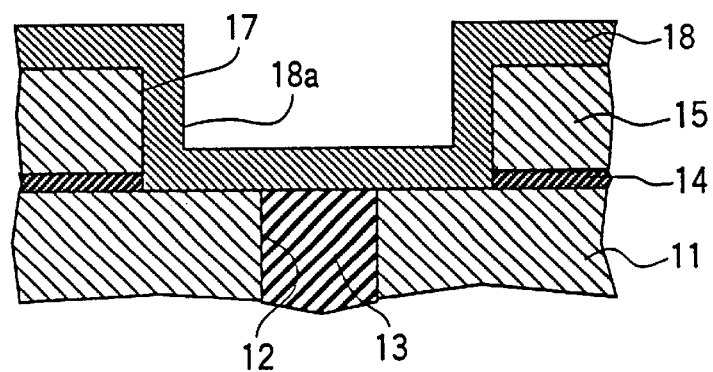

Next, as shown in FIG. 5c, the resist 16 is removed by ashing or the like. To ensure electric contact with the polycrystalline Si plug 13, native oxide (not shown) on the polycrystalline Si plug 13 is etched by dilute hydrofluoric acid or the like. Next, a polycrystalline Si film 18 containing phosphorus or the like is deposited on entire surface by the CVD method. As a result, a concave portion 18a corresponding to the opening 17 is formed in the polycrystalline Si film 18.

Figure 6A:
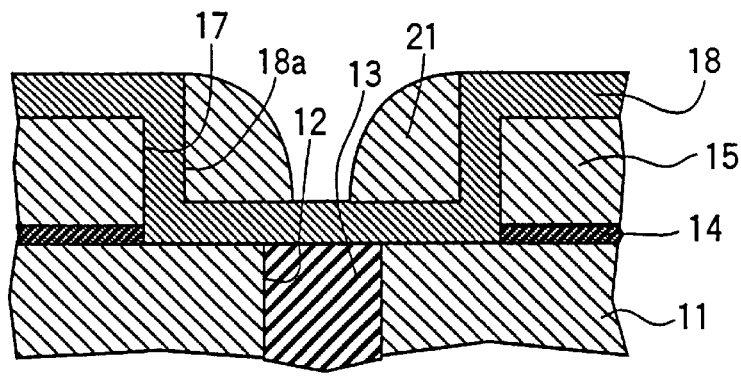
FIGS. 6a, 6b and 6c are side sectional views sequentially indicating intermediate processes of the manufacturing method according to the embodiment of the present invention.
Figure 6B:
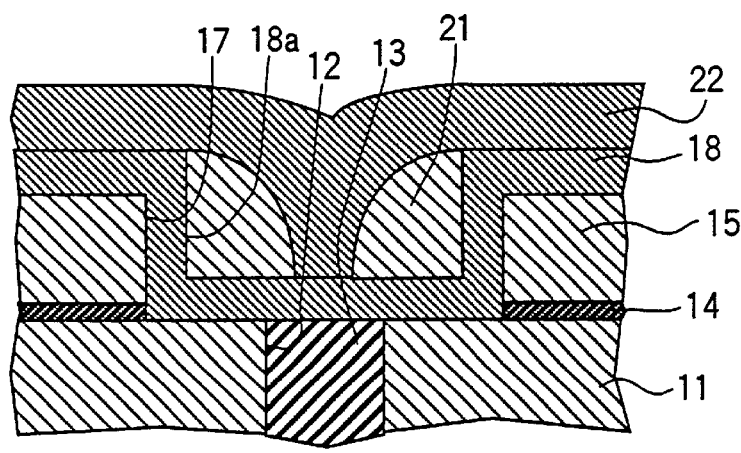

Next, as shown in FIG. 6a, an $SiO_2$ film 21 is deposited on entire surface by the CVD method and a side wall made of the $SiO_2$ film 21 is formed on an inner side surface of the concave portion 18a by etching back the $SiO_2$ film 21 by RIE. After that, as shown in FIG. 6b, a polycrystalline Si film 22 containing phosphorus or the like is deposited on entire surface by the CVD method. At this time, because a space surrounded by the $SiO_2$ film 21 is small, the space inside of the $SiO_2$ film 21 is filled with the polycrystalline Si film 22.

Figure 6C:
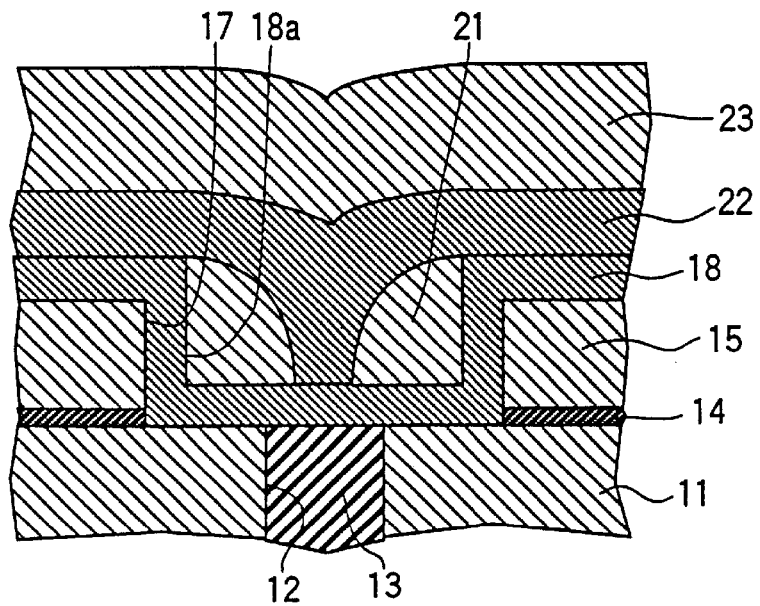
Figure 7A:
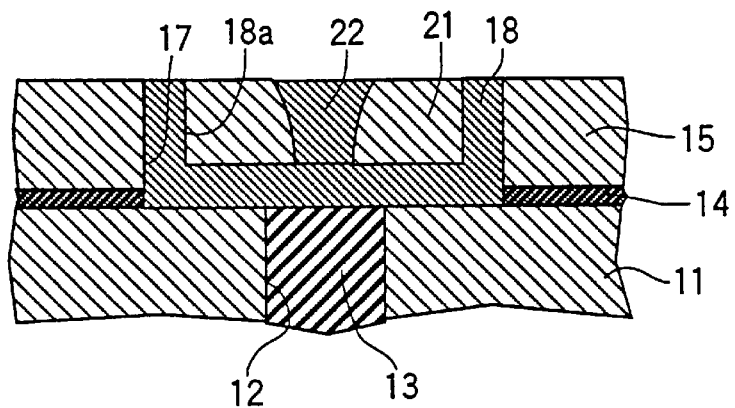
FIGS. 7a, 7b and 7c are side sectional views sequentially indicating final processes of the manufacturing method according to the embodiment of the present invention.

Next, as shown in FIG. 6c, an $Sio_2$ film 23 is deposited on entire surface by the CVD method or the like. Then, as shown in FIG. 7a, by chemical mechanical polishing, the surfaces of the polycrystalline Si films 18 and 22 and the $SiO_2$ films 15 and 21 are planarized and the polycrystalline Si film 18 placed along the inner side surface of the opening 17 and the polycrystalline Si film 22 are separated by the $SiO_2$ film 21.

Figure 7B:
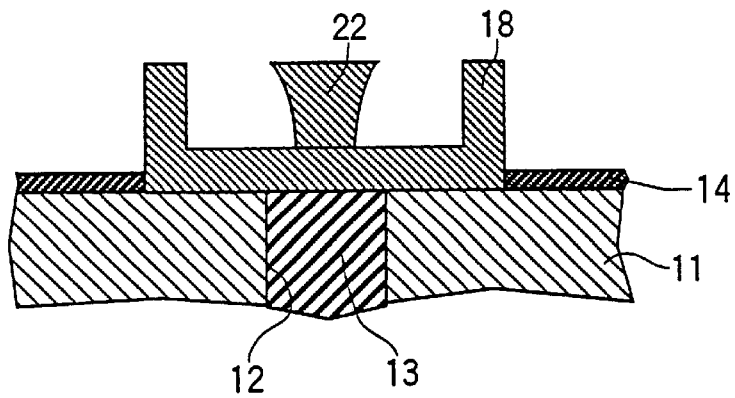
Figure 7C:
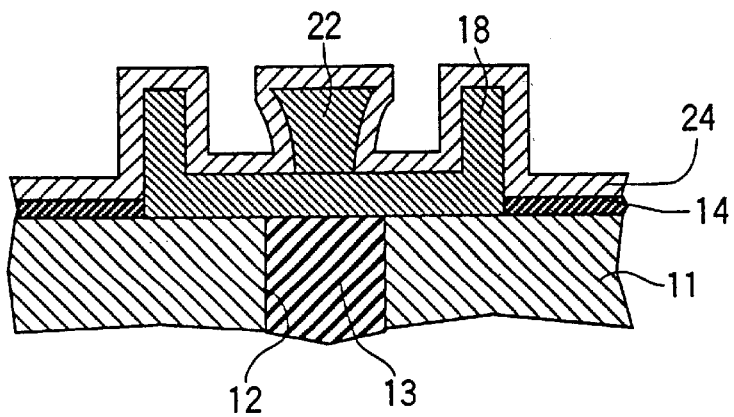

Then, as shown in FIG. 7b, the $SiO_2$ films 15 and 21 are etched with dilute hydrofluoric acid and then the lower electrode constituted of the coaxial polycrystalline Si films 18 and 22 is formed. At this time, the $SiO_2$ film 11 is not etched by dilute hydrofluoric acid because the SiN film 14 acts as a stopper. After that, as shown in FIG. 7c, a $Ta_2O_5$ film 24 is formed as a dielectric film. Or it is permissible to form an ONO film, a BST film, an STO film or the like instead of the $Ta_2O_5$ film 24.

Usually, an annealing is carried out before and after forming the dielectric film. For example, if the $Ta_2O_5$ film 24 is a dielectric film, prior to formation of the $Ta_2O_5$ film 24, a rapid thermal nitrization is carried out to prevent the polycrystalline Si films 18 and 22 from being oxidized by oxygen in the $Ta_2O_5$ film 24 so as to form thin SiN film (not shown) on the surface of the polycrystalline Si films 18 and 22. Further, to reduce leak in the $Ta_2O_5$ film 24 due to loss of oxygen, an annealing is conducted in oxygen after the $Ta_2O_5$ film 24 is formed.

As shown in FIG. 4, the polycrystalline Si film 25 containing phosphorus or the like is deposited on entire surface by the CVD method so as to form an upper electrode called a plate electrode, which is an electrode opposing the storage node electrode. After that, although not shown, an interlayer insulating film, a metallic wiring, a passivation film and the like are formed to complete this DRAM.

In the capacitor of the present embodiment manufactured in the above manner, even if miniaturization and large capacity of the DRAM are attained so as to reduce memory cell area and the plane area of the capacitor is reduced to such an extent that the lower electrode of double cylinder type like the second conventional example shown in FIGS. 2a and 2b cannot be realized, the surface area of the lower electrode is larger than that of the first conventional example shown in FIG. 1 so that its electric storage capacity is larger.

Thus, it is possible to increase the memory cell capacity without increasing a plane area of the capacitor thereby improving the reliability of the DRAM. Further, if it is not necessary to increase the memory cell capacity, the plane area of the capacitor can be reduced so that consequently the memory cell area can be reduced thereby decreasing the manufacturizing cost of the DRAM.

Although in the above embodiment, the polycrystalline Si film 18 and the crystalline Si film 22 which constitute the lower electrode of the capacitor are a square cylinder and a substantially square pillar respectively, these may be formed in other shape such as a circular cylinder, a circular pillar or the like.

Even if the opening of the mask for forming the opening 16a in the resist 16 by lithography is square, a corner portion of the opening 16a is rounded by proximity effect or the like at the time of lithography, thus actually the polycrystalline Si film 18 becomes a circular cylinder, an oval cylinder or the like and the crystalline Si film 22 becomes a circular pillar, an oval pillar or the like. However, in this case also, because the surface area of the lower electrode is not so different, the previously mentioned formula for the surface area S is valid.

Although the above-described embodiment is an embodiment in which the capacitor of the present invention is applied to a DRAM memory cell, the capacitor of the present invention can be applied to a semiconductor device other than the DRAM.

What is claimed is:

1. A capacitor comprising:

a lower electrode defined by a conductive film having (1) a U-shaped cross-sectional configuration in each of two orthogonal directions formed by a base having upper and lower surfaces and a peripheral edge and an upstanding peripheral sidewall extending upwardly and perpendicularly from the base surface along the peripheral edge, the sidewall having a height dimension H, as measured from the bottom surface of the base, and a thickness d, the base also having a thickness d, and (2) an upstanding pillar projecting upwardly from a central portion of the base surface and having a foot portion adjacent the base surface and an upper surface opposite the foot portion, the pillar having a height H which is the same as the height of the upstanding sidewall, and the foot portion having a cross-sectional width dimension which is smaller than a cross-sectional width dimension of the upper surface of said pillar such that said pillar includes tapering side surfaces extending between the upper surface and the foot portion facing the upstanding peripheral sidewall and so that the pillar side surfaces are in spaced apart relation from said sidewalls;

a capacitive insulating film disposed on said lower electrode and covering the upstanding peripheral sidewall, the base upper surface and the tapering side surfaces and upper surface of the pillar;

an upper electrode defined by a conductive film disposed on the capacitive insulating film including a depending sidewall concentrically disposed projecting between the side surfaces of the pillar and the upstanding peripheral sidewall.

2. A capacitor as defined in claim 1, wherein the tapering side surfaces of the pillar are curved surfaces.

3. A capacitor as defined in claim 1, wherein the base and the upstanding peripheral sidewall of the lower electrode comprise a unitary deposited film.

4. A capacitor as defined in claim 1, wherein the lower electrode and the upper electrode comprise a doped polycrystalline Si film.

5. A capacitor as defined in claim 1, wherein the lower electrode and the upper electrode comprise a phosphorus doped polycrystalline Si film.

6. A capacitor as defined in claim 1, wherein said lower electrode comprises a portion of a storage node electrode of a memory cell.

\* \* \* \* \*